US006912381B2

United States Patent
Murtojarvi

(10) Patent No.: US 6,912,381 B2
(45) Date of Patent: Jun. 28, 2005

(54) PROCESSING RECEIVED SIGNALS

(75) Inventor: Simo Murtojarvi, Salo (FI)

(73) Assignee: Nokia Corporation, Espoo (FI)

( * ) Notice: Subject to any disclaimer, the term of this patent is extended or adjusted under 35 U.S.C. 154(b) by 443 days.

(21) Appl. No.: 10/060,653

(22) Filed: Jan. 30, 2002

(65) Prior Publication Data

US 2002/0168956 A1 Nov. 14, 2002

(30) Foreign Application Priority Data

Feb. 6, 2001 (GB) ............................................. 0102942

(51) Int. Cl.⁷ ................................................ H09B 1/30
(52) U.S. Cl. ................... 455/296; 455/130; 455/226.1; 455/232.1; 455/239.2; 455/239.1; 327/307
(58) Field of Search ................................ 455/290, 130, 455/232.1, 234.1, 324, 303, 341, 305, 67.11, 67.12, 67.13, 209, 141, 234.2, 226.1, 239.1, 246.1, 247.1, 310, 317, 186.1, 126; 327/307, 316, 309, 310; 375/345, 316, 319, 317, 318

(56) References Cited

U.S. PATENT DOCUMENTS

| 5,212,826 | A | | 5/1993 | Rabe et al. | |
|---|---|---|---|---|---|
| 5,621,349 | A | | 4/1997 | Kim et al. | 329/325 |
| 5,789,959 | A | * | 8/1998 | Dielacher et al. | 327/303 |
| 5,898,912 | A | * | 4/1999 | Heck et al. | 455/234.2 |
| 6,144,243 | A | * | 11/2000 | Vaisanen | 327/307 |
| 6,509,777 | B2 | * | 1/2003 | Razavi et al. | 327/307 |
| 6,735,422 | B1 | * | 5/2004 | Baldwin et al. | 455/232.1 |
| 2002/0168951 | A1 | * | 11/2002 | Paulus et al. | 455/130 |
| 2004/0053586 | A1 | * | 3/2004 | Simmons et al. | 455/130 |

FOREIGN PATENT DOCUMENTS

| WO | WO97/29552 | 8/1997 |
|---|---|---|
| WO | WO 98/10523 | 3/1998 |
| WO | WO00/51254 | 8/2000 |

* cited by examiner

Primary Examiner—Pablo N. Tran

(57) ABSTRACT

A method and circuitry for a receiver are disclosed. In the method a signal is received in a signal processing path of the receiver. Direct voltage that is present in the received signal is reduced by compensation means (12). The amplitude of the signal is attenuated by frequency selective attenuation means (10) during the direct voltage reduction by the compensation means (12).

31 Claims, 8 Drawing Sheets

PROCESSING RECEIVED SIGNALS

FIELD OF THE INVENTION

The present invention relates to processing of received signals, and more particularly, but not exclusively, to reduction of direct voltage from received radio signals. The invention can be applied, for example, in stations that are adapted for receiving data over a wireless interface.

BACKGROUND OF THE INVENTION

In wireless communication systems data may be transmitted between the transmitting and receiving stations over an air interface. The data may be transferred in data entities referred to as burst. Several stations may be enabled to transmit bursts over a single transportation channel. In order to enable this the bursts are multiplexed by means of an appropriate multiplexing technique before being output from a transmitter part of a station.

For example, in the GSM (Global System for Mobile communication) eight mobile stations may communicate over the same frequency by means of time division multiplexing (TDM). The length of a burst corresponds to a TDM time slot. With the TDM, eight time slots are carried by a single GSM frequency channel. Several station may use the same time slot but on different frequency channels. The GSM uses time division multiple access (TDMA) technique for allocating the time slots for different transmissions.

When a radio frequency (RF) signal is received at a receiver the signal needs typically to be down-converted from the radio frequency to baseband frequency. In a direct conversion receiver the radio frequency signal is converted directly to a baseband signal without converting the incoming signal first to one or several intermediate frequencies. Hence the direct conversion receivers are sometimes referred to as zero intermediate frequency receivers.

In a typical multi-frequency band and multi-system direct conversion receiver a radio frequency (RF) signal obtained from antenna means is conducted through band splitter means to split the signal in appropriate frequency bands. In each of the frequency bands the signal is conducted through a band filter. The signal in each of the frequency bands may also be amplified by appropriate pre-amplifier means. A gain control function (e.g. a low noise amplifier (LNA) gain control) can be used for controlling the level of the gain. If the own received signal is substantially strong, the one or more of the amplifiers may be switched to a smaller amplification level at the amplification (RF gain) step.

The amplified RF signal in each of the frequency bands is then typically demodulated or mixed to baseband in-phase (I) and quadrature (Q) signals by band mixer means. In a typical arrangement only one band of the plurality of bands is active at the same time. Said band mixer means (e.g. I/Q demodulator) typically comprise a mixer pair, one for the 0 degree and one for the 90 degree phase shift. The demodulation functions may be accomplished based on a local oscillator signal. The oscillator signal may be received from a synthesiser. It is also possible to combine the RF signals before the mixer means, e.g. by means of collector loads of the preceding amplification stage. In this case only one mixer pair is needed.

The mixer pairs typically share a common collector load. That is, all mixers of the I band share a common collector load and all mixers of the Q band share a common collector load. Thus the I and Q signals in all bands are transported after the demodulation step on respective common I and Q signal paths or channels. A resistor load may be used at the collector such that a capacitor is connected in parallel with the resistor to attenuate any strong signals that exist outside the channel. This is done in order to prevent the strong signals to interfere with the "own" signal on the path.

It is noted that in this specification the term "own" refers to a signal, burst, channel and so on that is intended to be received and/or processed by the particular receiver components under consideration.

After the demodulation the signal is amplified and possibly low-pass filtered to attenuate further the out-of-channel signals before the signal is input in an active channel filter. The gain is required in order to enable use of substantially high impedance levels in the channel filter without worsening the noise performance of the receiver.

With high impedance levels it is possible to use small, integrated capacitors. This enables integration of the channel filter with other components of the receiver. The channel filter may also be made programmable whereby it is possible to use the same channel filter for signals of different communication systems.

Automatic gain control (AGC) and removal i.e. compensation of direct voltage (DC compensation) are carried out after the channel filtering. After the AGC and direct voltage reduction functions the I and Q signals are fed to an analogue to digital (A/D) converter and processed with digital signal processing means so that the sound or data represented by the transmitted signal can be reproduced.

The direct conversion receiver employs no intermediate frequency stages and thus the design thereof requires substantially few components. This allows a substantially simple overall construction of the receiver and makes it thus advantageous in many applications.

In mobile stations such as mobile telephones direct conversion receivers are, however, only rarely used. The prior known direct conversion methods are considered as almost impossible to implement if the mobile stations are to be manufactured in an industrial scale. In addition, the known direct conversion solutions are not capable of addressing the unique features and specific problems of digital mobile telecommunication systems. This is so for several reasons.

A problem that is faced when implementing a direct conversion receiver is the control of offset voltages. The term "offset voltage" (or direct conversion offset error) refers to an error voltage which has become summed up in the receiver into the signal as an essentially direct voltage. The inclusion of the offset voltage in the received useful signal should, however, be avoided.

One general problem with the offset voltage is that the offset voltage may become summed up into baseband signals. This can happen, for example, in I/Q receivers which are generally used in mobile communications or in any other receiver in which a baseband in-phase signal (I) and quadrature signal (Q) are formed. This is a particular problem in the direct conversion receivers where the received RF signal is converted directly to a baseband that extends to near the zero frequency. The offset voltage may be considerably higher than what the pre-stage noise is. In such a case the signal-to-noise ratio may deteriorate substantially much.

The formation of the offset voltage can be caused by many different factors. The offsets caused by the mixer stage and the amplifier stages may cause the error. The local oscillators may leak to the RF stages and/or the input of the mixer. In this case the leak may become mixed with itself thereby forming a DC (direct current) signal at the output of the mixer.

The local oscillator may itself become linked to the front of the receiver (that is to high or radio frequency parts of the receiver) in which case the local oscillator signal obtains access to the radio frequency port of the I/Q demodulator. Thus the linked local oscillator signal becomes mixed with the actual signal from the local oscillator entering the local oscillator port thereby forming an offset signal (DC voltage) at the output of the mixer (so called self mixing).

At a receiver using intermediate frequency, the second local oscillator signal can itself become linked to the first local oscillator signal. In this case the signals get mixed with each other in the first mixer and as a result they form a mixing result which impacts on the intermediate frequency and generates offset voltage at the output of the I/Q demodulator.

In addition, a strong RF signal in any frequency at the input side of a mixer may leak also to a local oscillator branch, whereby a similar self-mixing occurs as in the above with the oscillator signal. The harmonic frequency of a clock oscillator which impacts on the channel frequency can also become mixed with the local oscillator signal and form a direct voltage at the output of the mixers in the I/Q demodulator. In addition, offset voltage can be generated in the baseband signals from switching on the supply voltages of the receiver.

The skilled person is aware of the phenomena leading to generation of offset voltage, and this is thus not described in more detail herein.

Several methods are known for mitigating i.e. removing the offset voltage. For example, if the offset voltage could be kept constant during the entire reception time, it might be possible to remove the offset voltage digitally. However, it is difficult to maintain a constant offset voltage. Even if a constant offset voltage is obtained, then the dynamics of the analogue/digital (A/D) converter should be extended by the highest possible offset voltage. This may make the A/D converters too expensive for some applications. In addition, any additional digital signal processing would require higher clock frequencies. This may lead, in turn, to increased current consumption. Publication WO 97/29551 and especially FIG. 2 thereof discloses a simple circuitry for the removal of the DC offset voltage and thus the error in the DC. Publication WO 97/29552, and especially FIGS. 5 and 6 thereof, discloses another prior art circuitry for the removal of the DC offset voltage. The present application shows said FIGS. 5 and 6 as FIGS. 1A and 1B, respectively. These prior art DC removal arrangements employ one stage RC low-pass filtering in the DC removal branch.

The DC removal arrangement is typically such that the receiver switches between DC removal and reception modes based on a time constant. The time constant defines the timing before the beginning of a burst when the DC compensation should be started. For example, some components may be arranged to start the DC removal operation 100 $\mu s$ before the beginning of an own burst.

For example, in FIG. 1A the removal branch capacitors C2 and C3 are loaded through several resistors R5 to R7. By means of this is possible to prevent substantial loading of the high frequency signals into the DC removal capacitors C2 and C3. At the end of the DC removal period a desired amplification is switched on by means of automatic gain control (AGC) switches.

Since the FIG. 1A circuitry is only capable of keeping the DC voltage in the same level as what the voltage was on line Vq2 when input to the circuitry a second DC removal circuitry (DCN2) is required. Possible circuitry for the second removal circuitry is shown in FIG. 1B. In the second DC removal circuitry a further capacitor component C61 is loaded with a reference voltage Vref during the DC removal. A possible AC voltage component is kept in the same voltage level and phase at both ends of the capacitor C61 by means of a high-pass filter 64 and an adder 65.

The above discussed arrangement may enable a sufficient DC removal for a communication system such as the GSM (Global System for Mobile communications) without requirement for e.g. a software controlled DC removal operated in a burst by burst manner. However, in order to enable a sufficiently quick DC removal the time constant that is used for the control of the DC removal periods has to be selected to be substantially low. Thus the attenuation of the own signal is not substantially high. Because of this a small error may remain in the capacitors C2 and C3.

In addition, so called tail bits exist in the beginning and end of each transmission burst. These tail bits introduce modulating frequencies to the signal. For example, in the GSM mode the modulating frequency of tail bits is about 67 kHz. In the EDGE mode (Enhanced Data Rate for GSM Evolution) the modulating frequency of the tail bits is about 55 kHz.

The tail bit frequencies cause an error voltage at the beginning of the burst. This is illustrated by FIG. 2A in which a small DC error can be seen in the beginning of a received burst. FIG. 2B illustrates the variations that are caused by the tail bits to the DC present in the DC removal capacitor. In the prior art this error has been compensated at the amplification stage in a speed that is defined by the time constant so that this initial error becomes removed towards the end of the burst.

If it could be possible to use a high RF gain and to prevent the local oscillator to leak into the input of the RF amplifier, the proportion of the offset voltage generated by the mixer could probably be kept in a substantially low level in the useful signal. However, in order to ensure a high dynamic range the RF gain has to be kept substantially low, otherwise the amplifier and/or the mixer could become blocked because of the high signal levels. Thus most of the amplification has to be done after the mixer (which acts in the direct conversion as a detector) and the subsequent channel filter in order to obtain the required signal levels at the A/D converter. However, this amplification will also amplify the DC offset voltage.

The above referenced DC errors may have substantially higher values than what the useful signal obtained from the detector has whenever the signal is at the sensitivity limit of the detector. Thus, in order to amplify the useful signal and to keep at the same time the DC level in a desirable value a DC compensation of the signal is required.

It may be desired to make the time constant smaller in order to decrease the current consumption. Smaller time constant might also enable faster monitoring of the neighbours and multi-slot type operation of the receiver. However, a smaller time constant causes an increase in the DC error, especially in the DC error that is caused by the own signal. In addition, some of the proposed new modulation techniques, such as the EDGE (Enhanced Data Rate for GSM Evolution) modulation are substantially more sensitive for errors. Thus a faster and more efficient DC removal is required for use in the applications employing these techniques.

SUMMARY OF THE INVENTION

Embodiments of the present invention aim to address one or several of the above problems.

According to one aspect of the present invention, there is provided a method in a receiver, comprising: receiving a signal in a signal path of the receiver; initiating reduction of direct voltage present in the signal; and attenuating the amplitude of the signal by frequency selective attenuation means during the direct voltage reduction.

In a more specific embodiment the frequency selective attenuation means filter a predefined frequency from the signal at a location on the signal path that is before the direct voltage reduction.

The amplitude that is to be attenuated comprises amplitude that is present at the beginning of a burst received in the signal path. In another embodiment amplitude that is present at the end of a burst received in the signal path may be attenuated. The amplitude subjected for the attenuation may be the amplitude caused by a tail bit of the burst.

The attenuation means may comprise a bandstop filter, a notch filter, a lowpass filter or a controllable channel filter.

The filter may be connected to the signal path for the duration of the direct voltage reduction and the signal may bypass the filter during reception of useful signal.

According to another aspect of the present invention there is provided a circuitry for a receiver, comprising: a signal path for processing a received signal; direct voltage compensation means for reduction of direct voltage present in the received signal; and frequency selective attenuation means adapted to attenuate the amplitude of the signal on the signal path during reduction of direct voltage by said compensation means, wherein said attenuation means are located after said selection means and before said compensation means on said signal path.

The frequency selective attenuation means are may be adapted to filter at least one predefined frequency at the same time said signal is subjected to direct voltage reduction by said compensation means. The frequency selective attenuation means may be adapted to attenuate amplitude that is present at the beginning and/or end of a burst carried by the received signal.

By means of the embodiments it is possible to provide a signal which has a lower amplitude during DC removal operations. Thus the error in the DC caused by the signal may also be made smaller. The time constant used for the DC removal can be made smaller. The smaller time constant enables faster DC removal and thus multi-slot operation and saves current.

BRIEF DESCRIPTION OF DRAWINGS

For better understanding of the present invention, reference will now be made by way of example to the accompanying drawings in which.

DESCRIPTION OF PREFERRED EMBODIMENTS OF THE INVENTION

Figure 3:
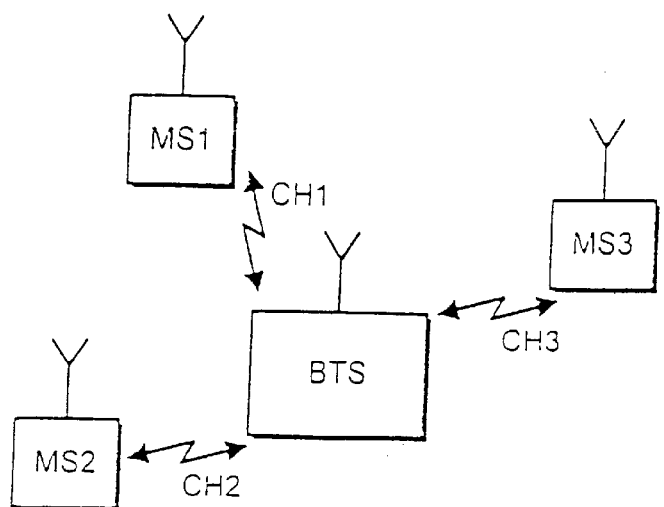
FIG. 3 shows a communication system in which the present invention may be employed.

Before explaining a preferred embodiment of the invention in more detail, a reference is made to FIG. 3 which shows a system in which the embodiments of the invention may be employed. The exemplifying system is a cellular mobile radio communication system allowing a plurality of mobile stations MS1, MS2, MS3 to communicate with a base (transceiver) station BTS via respective channels CH1, CH2, CH3. The stations are provided with necessary transceiver components (not shown in FIG. 3) so as to be able to handle radio frequency signals to be transmitted and received by respective antennae. The channels can be established over respective air interfaces. The operation of the system is typically controlled by one or more controller functions, such as by a base station controller (BSC). The possible controller arrangements as such are known and do not form a part of the invention, and will thus not be described in more detail herein.

The illustrated communication system may employ EDGE (Enhanced Data Rate for GSM Evolution) modulation for the communication. The EDGE has evolved from the GSM (Global System for Mobile communications). Therefore the characteristics of an EDGE based system require that some components thereof are back compatible with the GSM system.

Figure 4:
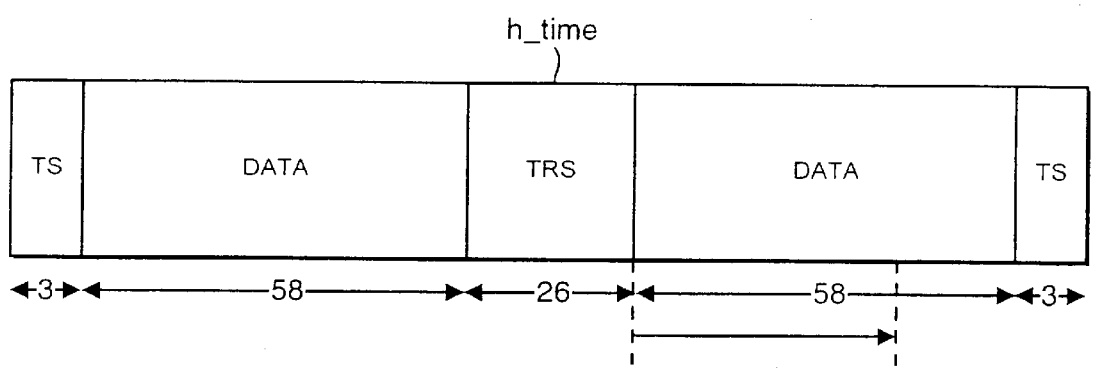
FIG. 4 shows a burst.

As discussed above, so called tail bits exist at the beginning and end of a burst transmitted over the air interface. FIG. 4 illustrates an example of a burst that is transmitted in a mobile communication system. FIG. 4 represents a burst received at a base station that operates according to the GSM standard. For a TDMA system according to the GSM standard, mobile stations transmit these bursts as modulated signals on frequency channels that have been allocated by a base station controller. One frequency channel may support up to eight bursts, each burst associated with a respective call, where each call is allocated a time slot in which to send the burst. Further details of a TDMA system according to the GSM standard are not described herein because they are known to a person skilled in the art.

The normal burst contains two packets of 58 bits (DATA) surrounding a training sequence (TRS) of 26 bits. Three tail bits (TS) are also added at each end of the normal burst. The training sequence (TRS) is a predetermined sequence of bits which is sent by the mobile station (MS) and is known at the base station controller (BSC). The training sequence is utilised at the base station to estimate the impulse response of the channel over which the burst is sent. The actual information which is transmitted is located in the data bits (DATA) of the burst. The tail bits are used for example for the initiation of the channel coding.

Figure 1A:
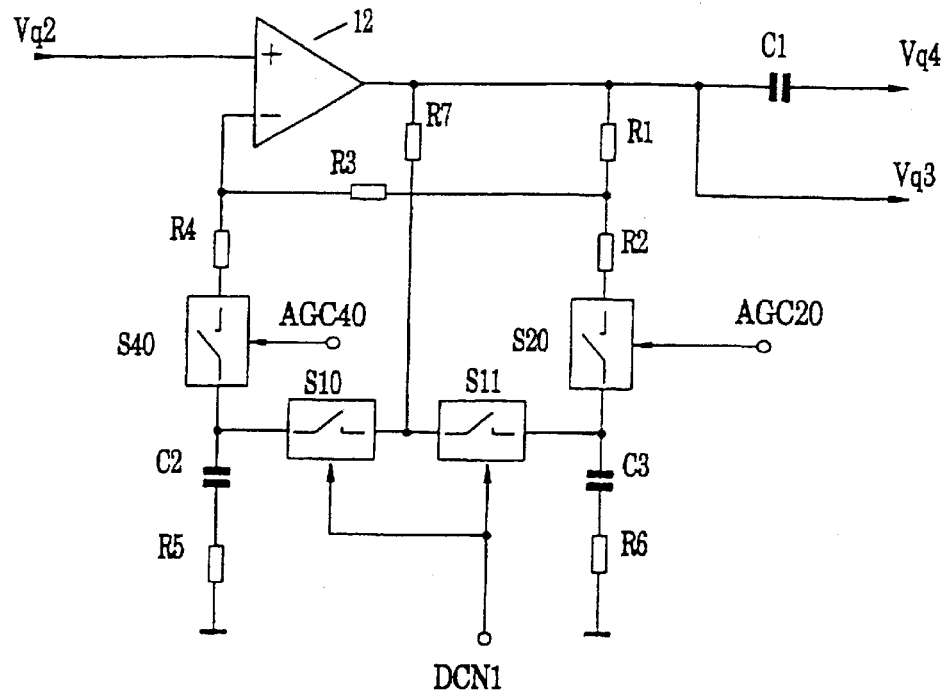
FIGS. 1A and 1B show a prior art arrangement for removing the offset voltage.
Figure 1B:
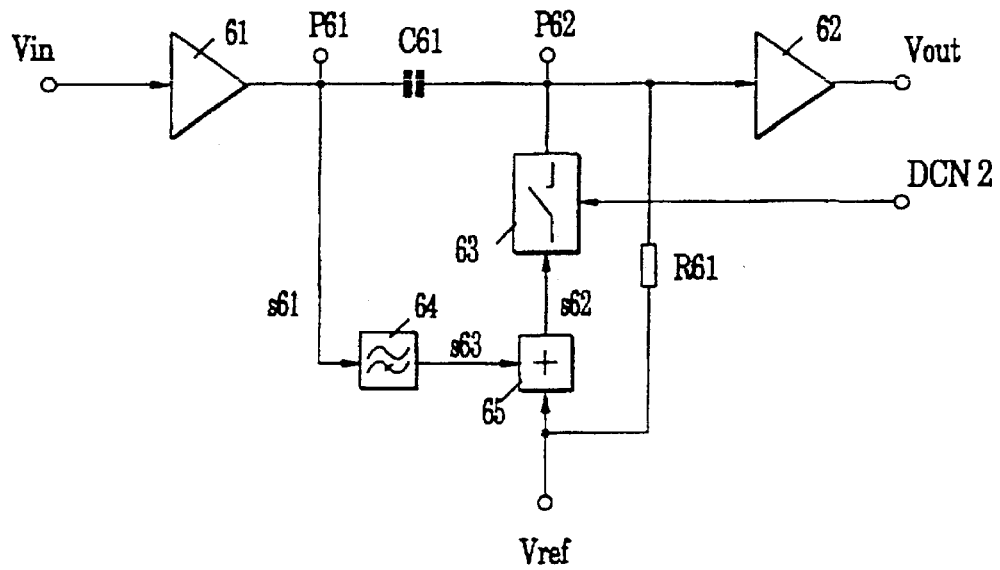
Figure 2A:
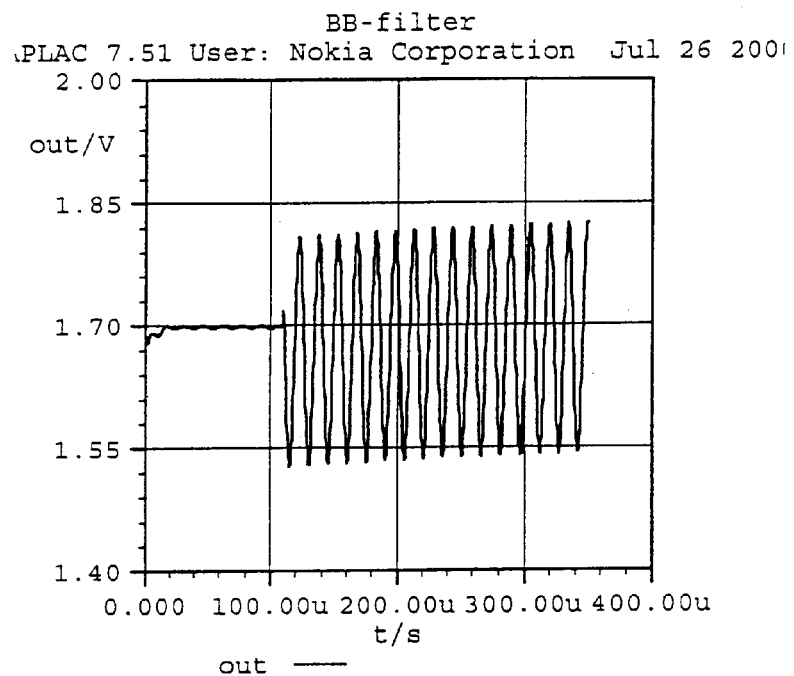
FIGS. 2A and 2B illustrate an output voltage curve and DC levels in a DC removal capacitor, respectively for a prior art arrangement.

In the GSM mode the frequency of tail bits is about 67 kHz in the I and Q signals. In the EDGE mode the frequency of the tail bits is about 55 kHz. The tail bit frequencies cause variation to the output voltage level, as is illustrated by the graph of FIG. 2A. As can be seen from FIG. 2B, the tail bits frequencies cause variations in the DC present in the DC removal capacitor. The following discusses in more detail embodiments by means of which it is possible to mitigate the problems caused by offset voltages, especially by the offset caused by the tail bits.

Figure 5:
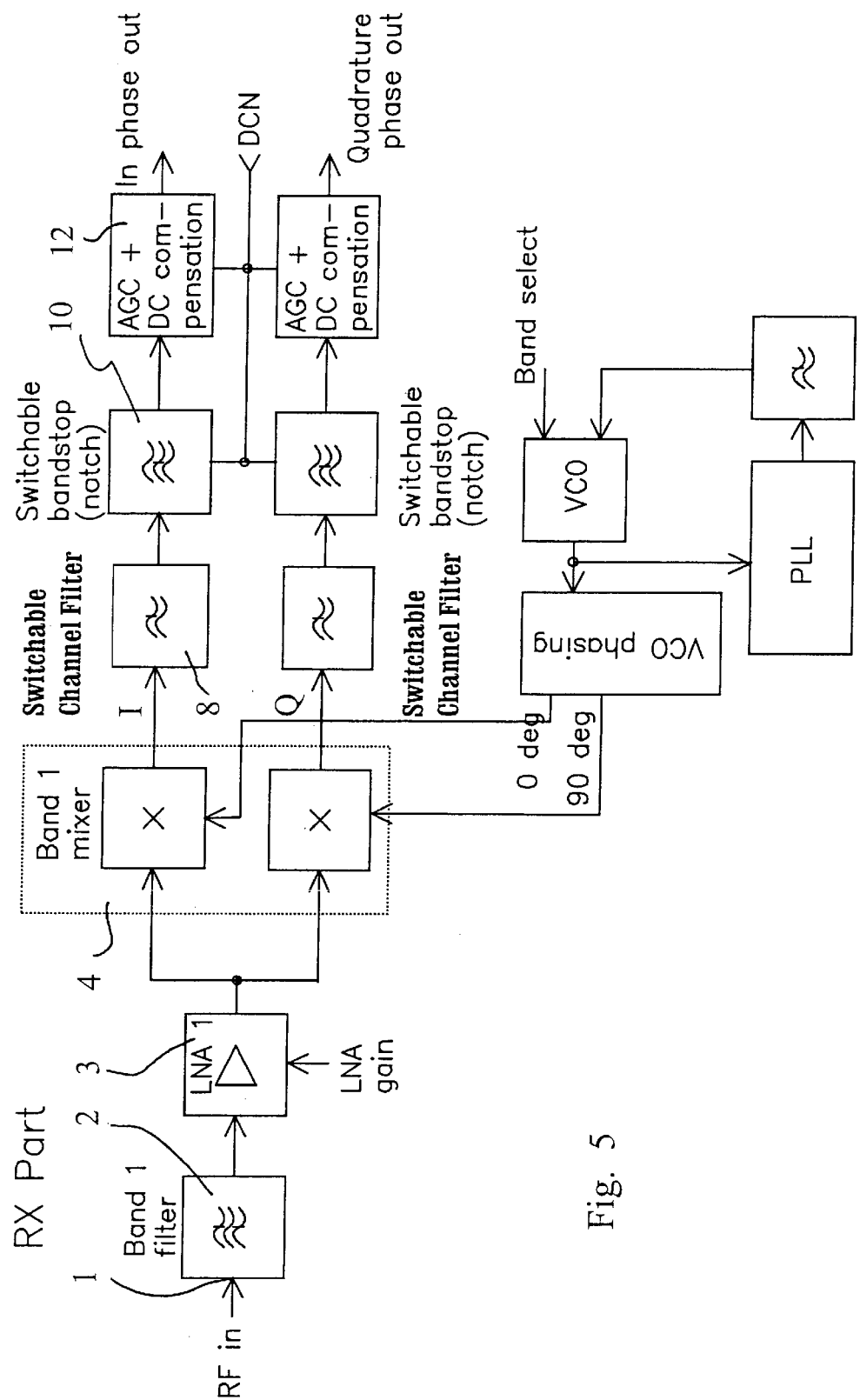
FIG. 5 shows a block diagram for circuitry in accordance with a preferred embodiment of the present invention.

FIG. 5 shows a block diagram for a circuitry that has been devised in accordance with a preferred embodiment of the present invention. More particularly, FIG. 5 illustrates components of a direct conversion receiver for a band of a multiband receiver. The other bands are omitted from the presentation for clarity reasons. The shown components are located between an antenna switch (RF in) 1 and in-phase (I) and quadrature phase (Q) signal outputs.

The signal path comprises as the first component thereof a band filter block 2. The band filtering block is for selection of a frequency band to be processed and for attenuating out-of-band signals. The frequency band selection is a known functionality and will thus not be explained in more detail.

The band filtering block 2 is followed by a linear amplifier block 3. The amplifier function may be provided by a low noise amplifier gain (LNA gain). The amplifier function is followed by mixer means 4 (demodulator). A channel filter means 8 are provided on both the I and Q signal paths after the mixer means. The channel filter means may be provided by a low-pass filter or any other appropriate filter means. The function of these components is also known by the skilled person, and will thus not be explained in any greater detail herein.

The characteristics of the filter means 8, for example the bandwidth or the stopband, may be controllable. The controllable channel filter means that may be referred to as switchable bandwidth filters may be used e.g. when the same filter means is used for different communication systems. If the receiver is for use with a single system, then the channel filter means may be of fixed type.

The channel filtering function is followed by controllable or switchable bandstop means 10 adapted to attenuate the signal present at the beginning and/or end of a burst. The operation of the bandstop means 10 will be explained in more detail after the following description of the remaining components on the signal path.

An AGC stage 12 is provided on the I and Q paths. The AGC stage 12 is shown to comprise DC compensation. The DC compensation on the data transportation channel can be timed such that the DC removal starts during the previous burst and ends at the beginning of the own burst. When the DC removal is ended, the gain can be set at the beginning of the own burst.

The level of the received signal may vary, e.g. between −102 dBm and −15 dBm. The automatic gain control (AGC) 12 is for use in the adjustment of the signal levels. The gain may be set e.g. by means of a digital signal processor (DSP), a microprocessor control unit (MCU) or a state machine (not shown in the Figures).

The inventor has found that it is possible to attenuate the above discussed tail bit frequencies by introducing on the signal path before the AGC stage 12 a controllable filter element 10 that can be switched to attenuate the tail bit frequencies during the removal of the DC voltage. The arrangement is preferably such that bandstop filter means 10 is connected to the signal path after the channel filter means 8 and before a DC compensation stage 12. However, it shall be understood that the filter means can be provided at any point on the I and Q signal paths before the DC removal stage.

The filter means 10 is preferably provided by means of a notch filter. Possible notch filters are discussed in more detail with reference to FIGS. 7 to 9. A notch filter can be added to both I and Q branches of the reception band. The arrangement is such that the signal becomes attenuated by the notch filter at the end and/or beginning of the burst.

More particularly, the filter arrangement is for attenuating the tail bit frequencies. The signal will also attenuate whenever the tail bit frequencies are present, that is just before the beginning of the own burst. If the DC removal is stopped when the tail bits are present the amplitude of the own signal can be kept in a substantially low level at the input of the DC removal stage. Thus the error caused by the own signal at this stage can also be kept in a substantially low level.

Figure 2B:
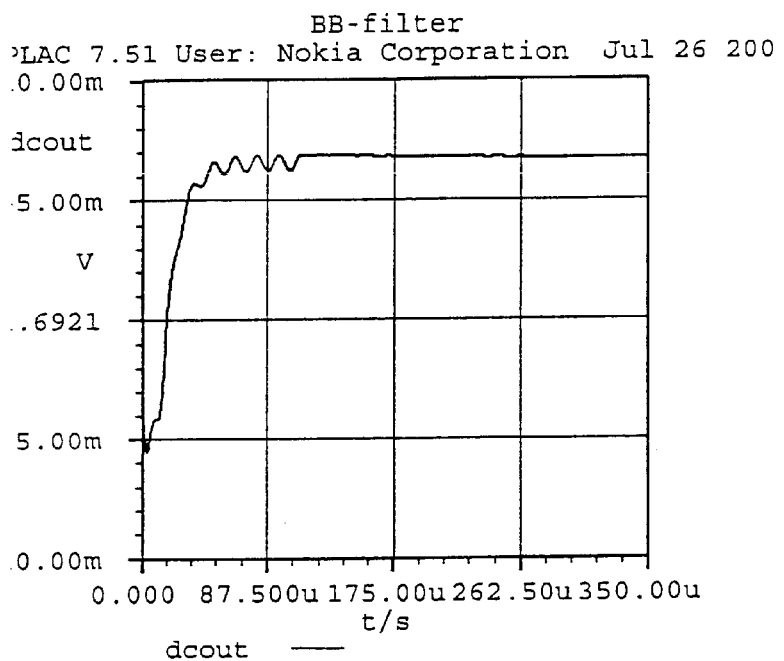
Figure 6A:
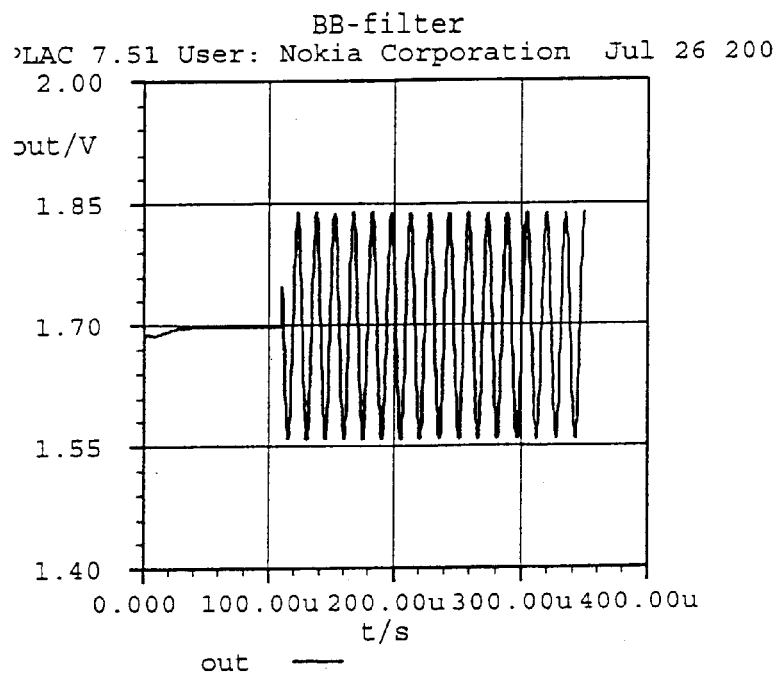
FIGS. 6A and 6B illustrate an output voltage curve and DC levels in a DC removal capacitor, respectively for an embodiment of the present invention.
Figure 6B:
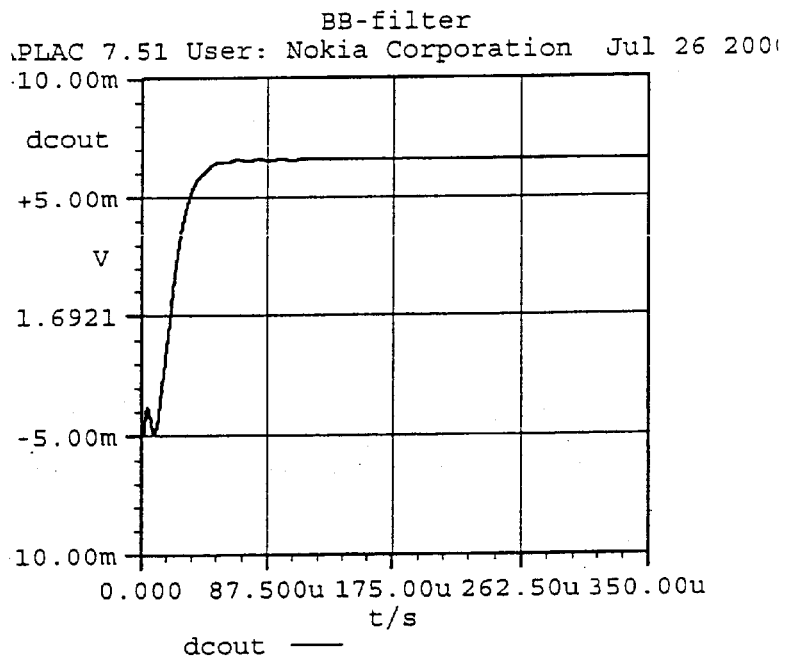

FIGS. 6A and 6B illustrate curves which correspond the curves of FIGS. 2A and 2B, respectively, but which curves have been obtained for circuitry comprising a notch filter. More particularly, FIG. 6A presents a signal output from the I (or Q) channel. The curve is obtained by an arrangement comprising a passive notch filter shown as block 10 in FIG. 7. As can be seen from the curve, when comparing to a corresponding curve of FIG. 2A obtained by a prior art arrangement, there is no DC voltage shift at the beginning of the burst. That is, the useful signal does not present any change of the DC level at the beginning of the burst (at about 110 μs). FIG. 6B illustrates the DC voltage in the DC compensation or removal capacitor of the DC removal block 12. When compared to FIG. 2B, it can be seen that the variation in the DC output during the DC removal (0 . . . 110 μs) is almost completely removed.

The notch filter 10 can be selectively switched between 'on' and 'off' modes thus enabling switching to an 'on' state for the duration of the DC removal phase. The disclosed circuitry arrangement is such that the notch filter 10 is connected to the signal path for the duration of the DC removal while the notch filter is by-passed on the other times.

Figure 7:
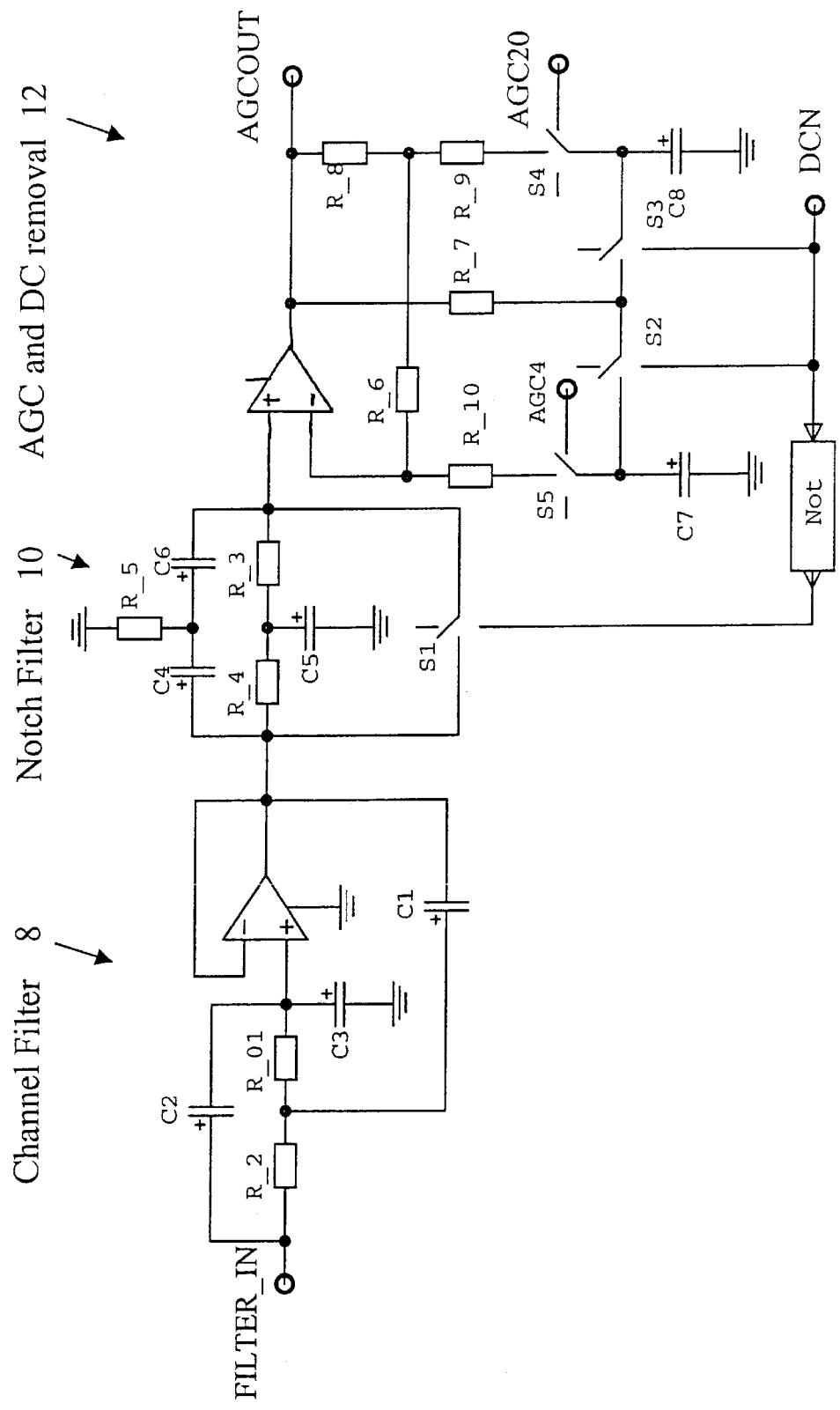
FIG. 7 is a circuit diagram illustrating in more detail a part of the FIG. 5 diagram.

FIG. 7 shows a possible circuitry for the blocks 8, 10 and 12 of FIG. 5. In the FIG. 7 circuitry arrangement the notch filter 10 is provided by a passive twin-T RC notch filter. More particularly, the twin-T notch filter is formed by capacitors C4 to C6 and resistors R3 and R5. The twin-T filter 10 is disposed between a channel filter 8 and a combined AGC and DC compensation stage 12. Passive RC notch filters as such are known by the skilled person and thus the operation and arrangement of the components thereof is not explained in any greater detail.

It is also possible to use an active notch filter in the circuitry. An active notch filter provides a narrower bandstop function than the passive filter, such as the passive filter shown in FIG. 7. By means of this the signal band may extend closer to the stop frequency which in turn allows a quicker DC removal, as the step response becomes faster. An active notch may be continuously connected on the signal path whereas the operation thereof is controlled e.g. based on a source follower.

Figure 8:
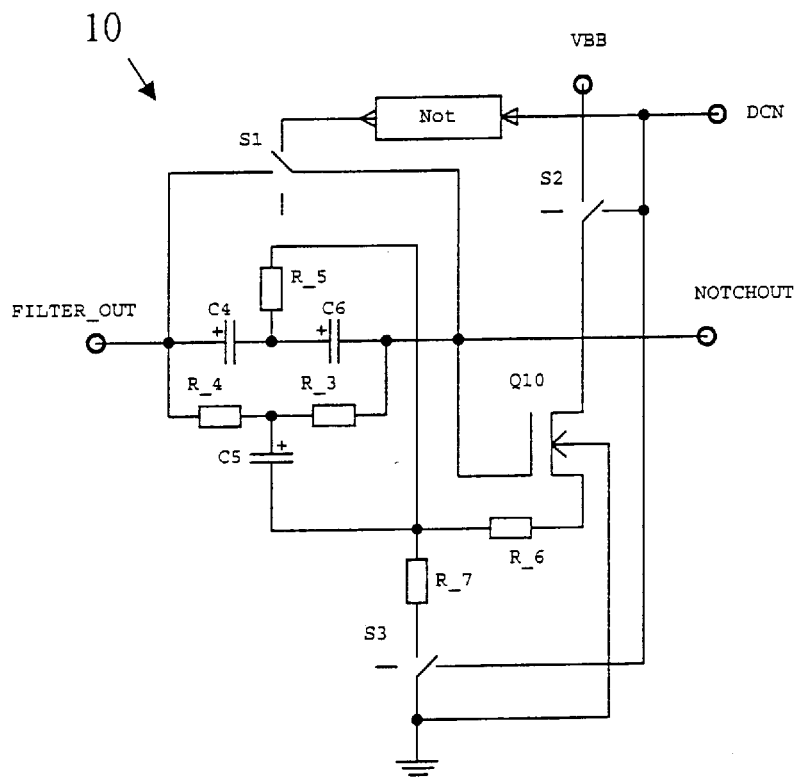
FIGS. 8 and 9 illustrate examples of possible notch filters.

FIG. 8 shows an example of an active twin-T notch filter 10. When switches S2 and S3 are closed the FET Q10 functions as a source follower (gain=1) and the circuitry operates as an active notch. If only switch S3 is closed, the FET Q10 is not provided with current and cannot thus operate. In practice this means that the circuitry may operate as a passive twin-T notch (if R_7<<R_5 and R_3 and R_4).

Switches S2 and S3 may be used to provide some savings in the current. They operate so that the FET Q10 is provided with the required current when the DCN control is on. Whenever the DCN is 'off' the source and drain of the of the FET are in a floating state and the FET does not consume current.

It shall be appreciated that switches S2 and S3 are not an essential requirement for the operation of the circuitry. The FET may also operate during the reception stage if switch S1 is closed. The function of the switches S2 and S3 is the activation of the amplifier. The amplifier could be activated also based on the same signal as what is used for the activation of an AGC amplifier (not shown in the drawings). However, use of the DCN signal for the control may save current.

Figure 9:
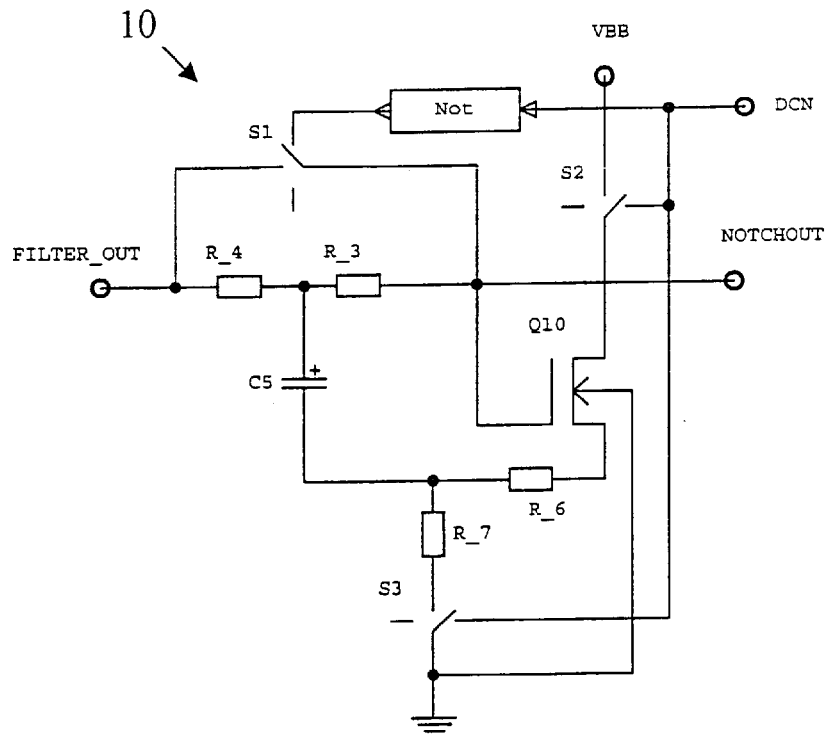
Figure 10:
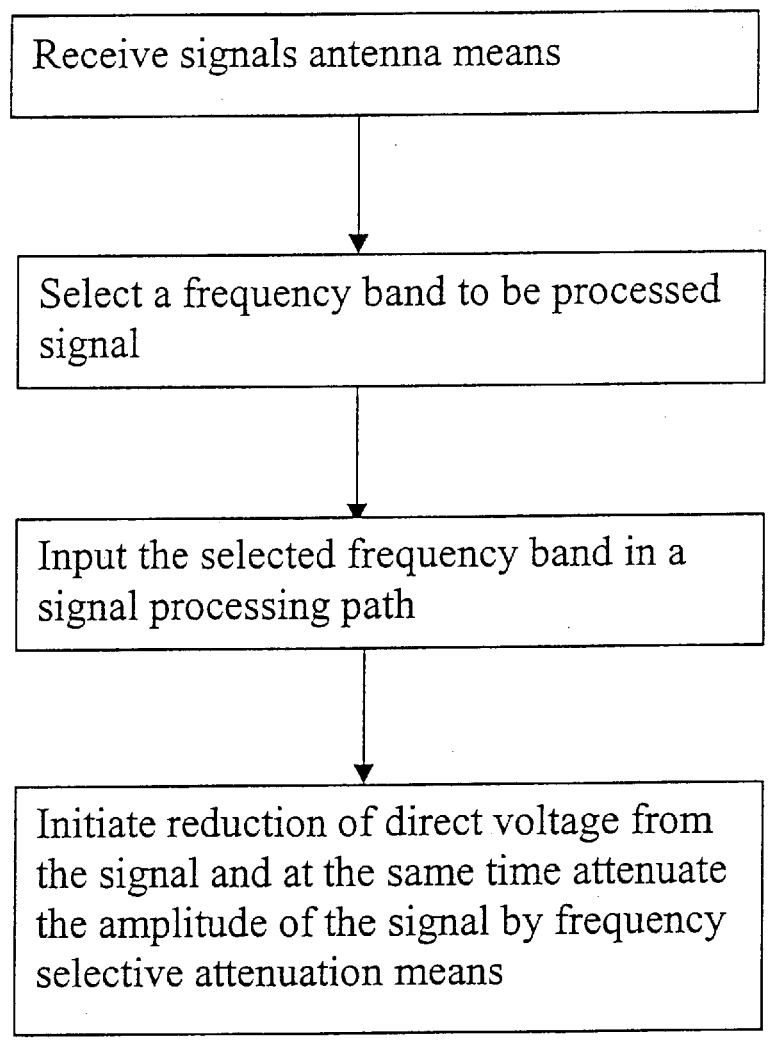
FIG. 10 is a flowchart illustrating the operation of one embodiment of the present invention.

The output of the notch filter 10 (NOTCHOUT) is also shown to have a feedback connection to the ends of a lateral resistor and lateral capacitor. The feedback connection is provided through a source follower FIG. 9 shows a simple bridged-T active filter that may also be used as a notch filter. It shall be appreciated that although the drawings show only twin-T and bridged-T notch filters, it is possible to use any type of notch filters for the circuitry.

The common point of the lateral branches of the notch arrangements of FIGS. 8 and 9 float when switches S2 and S3 are opened. Thus the notch should not influence the signal during the reception. However, if substantially small capacitors are used, the resistors have substantially high ohm values. The capacitance at the input of the next stage and the capacitance of the capacitors of the IC notch may decrease the frequency response. This is eliminated by introduction of switch S1 to the circuitry of FIG. 8 and FIG. 9. S1 is arranged such that whenever S1 is open at the same time when the DCN signal is 'on', the signal can bypass the notch during the reception.

In operation the receiver can be activated e.g. 100 µs before the beginning of the own slot and the DC removal is initiated. During the DC removal switches S2 and S3 are closed and switch S1 is open. Operation of switches S2 and S3 is controlled with control signal DCN. switch S1 is controlled with an inverted DCN signal. The DCN signal may be obtained e.g. from a DSP, MCU or a state machine. The gain is in its minimum and switches S4 (controlled by AGC20) and S5 (controlled by AGC40) are opened. The DC voltage of the AGCOUT output equals with the DC input to the twin-T notch filter 10. Said DC voltage is charged through resistor R7 and switches S2 and S3 to compensating capacitors C7 and C8.

The DC voltage removal is stopped when the own burst starts. In this example this occurs after said 100 µs. At this stage the DCN signal will be set to zero wherein switch S1 is closed and switches S2 and S3 are opened. Thus the notch filter becomes bypassed.

At the same time a desired gain of the signal can be set by switches S4 and S5 under control of control signals AGC20 and AGC40, respectively. The setting of the gain is a known feature and does not form an essential part of the invention, and is thus not explained in more detail.

If the short circuited notch filter 10 overloads the output of the channel filter too much it is possible to add further switches by means of which the notch filter 10 is isolated from the other parts of the circuitry during reception stage.

It is also possible to use other amplifiers for the feedback amplification than a source follower type arrangement. For example it is possible to use a emitter follower, operational amplifier or other similar component.

The above described filter function may alternatively be provided by means of a controllable channel filter. More particularly, a controllable channel filter can be switched to be narrower during the removal of the DC. For example, if a programmable channel filter is used for the filtering it can be set to a state for the duration of the DC removal in which it attenuates the tail bit frequency. By means of this it is possible to attenuate the signal at the end and beginning of the burst in accordance with the principles of the present invention.

The controllable channel filter may be located as the channel filter 8 of FIG. 7. To implement the invention a state is added in the channel filter in which it attenuates the tail bit frequency and to switch that state on for the duration of the DC removal. For example, in the GSM mode the channel filter shall be switched to a state where it attenuates 67 kHz and in the EDGE the channel filter shall be switched to attenuate 55 kHz.

In some applications it may not be possible to have beforehand knowledge of the modulation that is to be used for the reception of the signals, and thus a sufficient attenuation of more than one frequency may be required. If the described filter means is intended to be used with a plurality of different communication systems, it is also possible to adapt it to filter a frequency that is close enough to the tail bit frequencies of these systems. For example, circuitry to be used both for the EDGE (tail bit frequency 55 kHz) and the GSM (tail bit-frequency 67 kHz) may use a filter arrangement that filters about 60 kHz. This should still remove most of the disadvantageous tail bit frequencies.

In the circuitry of FIG. 7 the capacitor C2 could be used for implementing the described filtering function. By means of using appropriate switches it is possible to connect in parallel or in series with the resistors and capacitors further resistors and capacitors so as to change the characteristics. The change can be controlled e.g. by means of digital control signals. Such a channel filter can be switched to several different bandwidths e.g. in order to operate in different systems.

In operation the receiver is preferably switched on with the smallest appropriate gain. The LNA gain is switched to a state which gives the best result for the DC removal when considering the gain used for the reception. A short settling time period may be required after the receiver has been switched on. A reason for this is that when an initially powerless amplifier stages are switched on voltage variations may exist at the outputs of the stages until the stages have obtained their normal operational state, that is the DC operation points of the stages have been settled at the proper values thereof. If any DC removal is done during this settling period these undefined voltage variations (so called glitches) will be loaded into DC removal capacitors. Thus the DC removal is preferably switched on only after said operation points are settled. The status of the DC removal may be controlled by the DCN signal, as explained above.

If the time constant for the removal is short the switching of the LNA gain to an active mode can be accomplished shortly before the end of the DC removal stage. However, the switching is preferably accomplished such that a sufficient time for the removal of the DC voltage caused by the LNA gain and possibly by an external strong signal is provided. When an own burst begins, the DC removal is stopped and a desired signal gain is set.

It shall be appreciated that the gain values that need the activation of the LNA during the DC removal depend on the implementation of the circuitry. It shall also be clear that if the influence by the LNA gain to the DC is substantially small and if the signal is strong a smaller DC error may be obtained if the LNA gain is attenuated during the DC removal since the own signal and the DC error caused by the own signal are also smaller.

The resistors of the channel filters and the notch filters and possibly also the capacitors may be adjustable. The adjustable components may be required for example since the values of the resistors and capacitors may vary substantially. The variations may be caused, for example, because of changes in the manufacturing process of the IC circuits.

Controllable filters can be implemented by switching said components in series and/or in parallel by controllable switches. The same principle can be used to implement filters that have a different bandwidth in accordance with the requirements of different communications systems. In addition, it is correspondingly possible to change the stop frequency to match the system.

The circuitry may be provided with a state machine which performs the tuning of the filters automatically whenever the circuitry is initialised. The tuning may also occur by means of external signals and a DSP (Digital Signal Processor). It is also possible to save the tuned control values in a memory. By means of the stored parameters the tuning needs to be done only once and after this the parameters may be loaded from the memory whenever the circuitry is switched on.

The circuitry may also comprise tuning parameter registers for different systems. In this case the parameters can be loaded when the circuitry is switched on. If only one register is used for different systems new parameters need to be loaded therein whenever the system is changed. This can preferably be done by using a serial bus. By means of the bus the use of several wires for the control of the circuitry can be avoided. A serial bus can also be used for the activation and/or control of the other parts of the circuitry such as for the programming of a synthesiser possibly included in the circuitry.

It shall also be appreciated that the compensation of the DC can be implemented by various different manners. All of these can be used together with the herein described bandstop filtering.

By means of the embodiments it is possible to provide a signal which has a lower amplitude during a DC removal. Thus the error in the DC caused by the signal is also smaller. For example, by means of a notch filter an attenuation that is greater than 20 dB may be obtained for a signal and still the settling of the DC is quicker. In other words, the time constant used for the DC removal path can be made smaller and still it is possible to obtain an improved attenuation for the error caused by the signal. The faster time constant enables faster DC removal and thus saves current. The faster time constant may also enable the use of faster data classes (for example 4+1).

It should be appreciated that whilst embodiments of the present invention have been described in relation to mobile stations, embodiments of the present invention are applicable to any other suitable type of user equipment.

The embodiment of the present invention has been described in the context of EDGE and GSM systems that are based on use of TDMA. This invention is also applicable to any other standards and access techniques including code division multiple access, frequency division multiple access or time division multiple access as well as any hybrids thereof.

It is also noted herein that while the above describes exemplifying embodiments of the invention, there are several variations and modifications which may be made to the disclosed solution without departing from the scope of the present invention as defined in the appended claims.

What is claimed is:

1. A method in a receiver, comprising:
   receiving a signal in a signal path of the receiver;
   initiating reduction of direct voltage present in the signal; and
   attenuating the amplitude of the signal by frequency selective attenuation means during the direct voltage reduction.

2. A method as claimed in claim 1, wherein the frequency selective attenuation means filter a predefined frequency from the signal at a location on the signal path that is before the direct voltage reduction.

3. A method as claimed in claim 1, wherein amplitude that is present at the beginning of a burst received in the signal path is attenuated.

4. A method as claimed in claim 3, wherein the amplitude subjected for the attenuation is caused by a tail bit of the burst.

5. A method as claimed in claim 1, wherein amplitude that is present at the end of a burst received in the signal path is attenuated.

6. A method as claimed in claim 5, wherein the amplitude subjected for the attenuation is caused by a tail bit of the burst.

7. A method as claimed in claim 1, wherein the attenuation means comprise a bandstop filter.

8. A method as claimed in claim 1, wherein the attenuation means comprise a passive notch filter.

9. A method as claimed in claim 8, wherein the notch filter is connected to the signal path for the duration of the direct voltage reduction and wherein the signal bypasses the notch filter during reception of useful signal.

10. A method as claimed in claim 1, wherein the attenuation means comprise an active notch filter.

11. A method as claimed in claim 10, wherein the activity is provided by means that has been selected from a group consisting of a source follower, an emitter follower, and an operational amplifier.

12. A method as claimed in claim 11, wherein the active notch filter is connected to the signal path for the duration of the direct voltage reduction and wherein the signal bypasses the active notch filter during reception of useful signal.

13. A method as claimed in claim 1, wherein the attenuation means are provided by a lowpass filter.

14. A method as claimed in claim 1, wherein the attenuation means are provided by a controllable channel filter.

15. A method as claimed in claim 14, wherein the controllable channel filter is switched to produce a narrower filtering band for the duration of the direct voltage reduction.

16. A method as claimed in claim 3, wherein the direct voltage removal starts during reception of a previous burst and ends at the beginning of said received burst.

17. A method as claimed in claim 1, comprising the step of isolating the attenuation means from the signal path during reception of useful signal.

18. A method as claimed in claim 1, comprising step of adjusting the value of at least one resistor function of the receiver.

19. A method as claimed in claim 1, comprising step of adjusting the value of at least one capacitor function of the receiver.

20. A method as claimed in claim 1, comprising the steps of:
   storing tuning parameters of a communication system in a register; and
   retrieving said parameters during initialisation of the receiver.

21. A method as claimed in claim 1, wherein the signal bypasses the attenuation means during reception of useful signal.

22. A method as claimed in claim 1, wherein at least two different predefined frequencies are attenuated during the direct voltage reduction.

23. Circuitry for a receiver, comprising:

a signal path for processing a received signal;

direct voltage compensation means for reduction of direct voltage present in the received signal; and frequency selective attenuation means adapted to attenuate the amplitude of the signal on the signal path during reduction of direct voltage by said compensation means, wherein said attenuation means are located after said selection means and before said compensation means on said signal path.

24. Circuitry as claimed in claim 23, wherein the frequency selective attenuation means are adapted to filter at least one predefined frequency at the same time said signal is subjected to direct voltage reduction by said compensation means.

25. Circuitry as claimed in claim 23, wherein the frequency selective attenuation means is adapted to attenuate amplitude that is present at the beginning and/or end of a burst carried by the received signal.

26. Circuitry as claimed in claim 23, wherein the attenuation means comprise a bandstop filter.

27. Circuitry as claimed in claim 23, wherein the attenuation means comprise a notch filter.

28. Circuitry as claimed in claim 23, wherein the attenuation means are provided by a lowpass filter.

29. Circuitry as claimed in claim 23, wherein the attenuation means are provided by a controllable channel filter.

30. Circuitry as claimed in claim 23, comprising frequency band selection means.

31. A receiver comprising circuitry that comprises:

a signal path for processing a received signal;

direct voltage compensation means for reduction of direct voltage present in the received signal; and frequency selective attenuation means adapted to attenuate the amplitude of the signal on the signal path during reduction of direct voltage by said compensation means, wherein said attenuation means are located after said selection means and before said compensation means on said signal path.

\* \* \* \* \*